United States Patent [19]
Dass et al.

[11] Patent Number: 6,046,101
[45] Date of Patent: Apr. 4, 2000

[54] PASSIVATION TECHNOLOGY COMBINING IMPROVED ADHESION IN PASSIVATION AND A SCRIBE STREET WITHOUT PASSIVATION

[75] Inventors: M. Lawrence A. Dass, Fremont; Krishna Seshan, San Jose; Isaura Gaeta, Sunnyvale, all of Calif.

[73] Assignee: Intel Corporation, Santa Clara, Calif.

[21] Appl. No.: 09/001,970

[22] Filed: Dec. 31, 1997

[51] Int. Cl.[7] .......................... H01L 21/318; H01L 21/70
[52] U.S. Cl. ........................ 438/624; 438/786; 438/958
[58] Field of Search ................................. 438/791, 460, 438/501, 462, 624, 786, 958; 257/637, 797; 148/DIG. 28

[56] References Cited

U.S. PATENT DOCUMENTS

| 4,543,271 | 9/1985 | Peters | 427/583 |
|---|---|---|---|
| 5,132,252 | 7/1992 | Shiraiawa et al. | 438/462 |
| 5,521,125 | 5/1996 | Ormond et al. | 438/462 |
| 5,593,925 | 1/1997 | Yamaha | 1487/DIG. 28 |
| 5,627,403 | 5/1997 | Bacchetta et al. | 257/639 |
| 5,646,439 | 7/1997 | Kitayama et al. | 257/632 |
| 5,698,456 | 12/1997 | Bryant et al. | 438/6 |
| 5,795,815 | 8/1998 | Vokoun et al. | 438/462 |
| 5,795,821 | 8/1998 | Bacchetta et al. | 438/624 |
| 5,795,833 | 8/1998 | Yu et al. | 438/763 |
| 5,825,078 | 10/1998 | Michael | 257/632 |

*Primary Examiner*—Carl Whitehead, Jr.
*Assistant Examiner*—Maria Guerrero
*Attorney, Agent, or Firm*—Blakely, Sokoloff, Taylor & Zafman LLP

[57] ABSTRACT

An integrated circuit passivation layer including a first passivation layer portion of silicon nitride treated with nitrous oxide and a second passivation layer portion of polyimide. Also, a method of passivating an integrated circuit wafer including depositing a first passivation layer over the top surface of an integrated circuit wafer having a scribe street area between adjacent integrated circuit device portions, depositing a second passivation layer over the first passivation layer, and patterning the first passivation layer and the second passivation layer to expose the scribe street area.

2 Claims, 7 Drawing Sheets

PASSIVATION TECHNOLOGY COMBINING IMPROVED ADHESION IN PASSIVATION AND A SCRIBE STREET WITHOUT PASSIVATION

BACKGROUND OF THE INVENTION

1. Field of the Invention

The invention relates to the field of semiconductor testing and packaging and more particularly to integrated circuit bond pad exposure, packaging, and testing.

2. Description of Related Art

In the manufacture of semiconductor devices, it is advisable that such devices be tested at the wafer level to evaluate their functionality. The process in which devices in a wafer are tested is commonly referred to as "wafer sort." Testing and determining design flaws at the wafer level offers several advantages. First, it allows designers to evaluate the functionality of new devices during development. Increasing packaging costs also make wafer sorting a viable cost saver, in that reliability of each device on a wafer may be tested before incurring the higher costs of packaging. Measuring reliability also allows the performance of the production process to be evaluated and production consistency rated, such as for example by "bin switching" whereby the performance of a device is downgraded because that device's performance did not meet the expected criteria.

FIG. 1 illustrates a surface view of the top side of an integrated circuit device. Metal interconnect lines and components of integrated circuit device 11 are formed on an underlying silicon substrate. The side of the silicon substrate on which the integrated circuit is formed shall herein be referred to as the top side of the silicon substrate. As illustrated in FIG. 1, bond pads 13 are located along the periphery of integrated circuit device 11. In the center of integrated circuit device 11 is the active region 12 containing the majority of the high density, active circuitry of integrated circuit device 11. To activate the circuitry within active region 12, it is necessary to supply voltage signals to bond pads 13. These voltage signals are supplied to bond pads 13 through a package to which integrated circuit device 11 is affixed.

FIG. 2 illustrates a cross-section of integrated circuit device 11 after packaging. After integrated circuit device 11 is affixed to package substrate 15, individual bond wires 14 are used to electrically couple each bond pad 13 to a corresponding pad on package substrate 15. Each corresponding pad 13 on package substrate 15 is then individually coupled to an external pin 16. The packaged integrated circuit device of FIG. 2 may then be placed within a socket in order to electrically couple external pin 16 to drivers that supply the necessary voltage signal to activate integrated circuit device 11. As illustrated in FIG. 2, integrated circuit device 11 is mounted to package substrate 15 with its top-side facing away from package substrate 15. In this manner, once integrated circuit device 11 is activated through package pin 16, the internal, active region 12 may be accessed and probed for testing since neither bond pads 13, package substrate 15, nor bond wires 14 obscure access to this region of integrated circuit device 11.

FIG. 3 illustrates a top-side view of a second bond pad configuration on an integrated circuit device. As illustrated in FIG. 3, bond pads 21 of integrated circuit device 20 are formed along the top of the entire integrated circuit device so that the bond pads now reside directly over the active circuitry region of integrated circuit device 20. By forming bond pads in both the center and periphery of integrated circuit device 20, more bond pads can be placed across the surface of the device than can be placed only within the peripheral region. In addition, active circuitry which underlies bond pads 21 of integrated circuit device can be directly coupled to its nearest bond pad using relatively short interconnect lines. This minimizes the resistive, capacitive, and inductive effects associated with routing interconnect lines over long distances, improving speed performance.

FIG. 4 is an illustration of a cross-section of integrated circuit device 20 after mounting to a package substrate 22. In order to mount integrated circuit device 20 to package substrate 22, solder balls 24 are placed on each of bond pads 21 to electrically couple each bond pad 21 to its corresponding pad on package substrate 22. Each corresponding pad on package substrate 22 is, in turn, coupled to an external pin 23. Integrated circuit device 20 is mounted to package substrate 22 with its top-side facing towards the package substrate. In other words, in comparison to the method used to mount integrated circuit device 11 to its package substrate in FIG. 2, integrated circuit device 20 is "flipped." For this reason, the design of integrated circuit device 20 illustrated in FIG. 3 and its subsequent packaging method illustrated in FIG. 4 is referred to as flip-chip technology. The technology is also known as Controlled Collapsable Chip Connection (C4), named after the package mounting technique of using solder to replace bond wires.

As noted above, integrated circuit device 11 (as shown in FIG. 1) or integrated circuit device 20 (as shown in FIG. 3) are fabricated with other devices on a wafer or die. FIG. 5 schematically represents a wafer 25 having a plurality of integrated circuit devices, including devices 30 and 35. The individual devices 30 and 35 are separated from one another by scribe streets 37. Once individual devices 30 and 35 are fabricated and electrically tested, wafer 25 is cut or sawed along scribe streets 37 to separate the devices, e.g., individual microprocessors.

FIG. 6 is an expanded view of a portion of wafer 25 showing individual integrated circuit devices 30 and 35 separated by scribe street 37. Each integrated circuit device 30 and 35 includes bond pads 32 located around the periphery of the top surface of the respective integrated circuit devices. Each integrated circuit device 30 and 35 is surrounded by a guard ring 36. Guard rings 36 are generally formed of conductive material similar to bond pads 32, such as for example aluminum (Al), aluminum-copper (Al—Cu) alloy, or aluminum-copper-silicon (Al—Cu—Si) alloy. Guard rings 36 are placed on the outside of bond pads 32 and serve to protect integrated circuit devices 30 and 35.

As noted above, one purpose of scribe street 37 is to provide a sawing or cutting area to allow devices 30 and 35 to be separated. A second purpose of scribe street 37 is to provide an area to place test mechanisms to ascertain the viability and reliability of integrated circuit devices 30 and 35. FIG. 6 shows scribe street 39 having a plurality of electrical test pads (E-Test pads) that facilitate testing of bond pads 32 and 33 of integrated circuit devices 30 and 35, respectively. A third purpose of scribe street 37 is to provide a location for placing alignment landmarks, schematically illustrated in FIG. 6 by reference numeral 38. Alignment landmarks 38 are used by the fabrication tooling in placing and fabricating individual structures on devices 30 and 35.

FIG. 7 shows a schematic cross-sectional planar side view of integrated circuit devices 30 and 35 taken through line A—A of FIG. 6. FIG. 7 shows integrated circuit device 30 having bond pad 32 and guard ring 34, and integrated circuit device 35 having bond pad 33 and guard ring 36. Integrated circuit devices 30 and 35 are separated by scribe street 37. Scribe street 37 includes E-Test pad 39 for testing devices for integrated circuit 30 and/or 35.

FIG. 7 shows the top conductive (e.g., metal) line of the integrated circuit devices 30 and 35. In general, after the devices are fabricated, bond pads 32 and 33 and E-Test pad 39 lie beneath dielectric layers and must be exposed for testing and bonding to a suitable package. In a typical process, bond pads 32 and 33, guard rings 34 and 36, and E-Test pad 39 are covered by a hard passivation layer of, for example, silicon nitride ($Si_3N_4$). This hard passivation layer is covered by a soft passivation layer of, for example, a photodefinable polyimide. Together, the hard and soft passivation layers protect the device from the ambient, for example, scratches, moisture, and impurities.

FIGS. 8–10 illustrate the prior art process for exposing bond pads 32 and 33 of integrated circuit devices 30 and 35, respectively, and E-Test pad 39. As shown in FIG. 8, overlying the metal structures of integrated circuit devices 30 and 35 is a conformally deposited hard passivation layer 40, such as for example, silicon nitride. Next, as shown in FIG. 9, soft passivation layer 45, such as for example a photodefinable polyimide, is deposited over hard passivation layer 40.

FIG. 10 illustrates the processing steps of exposing bond pads 32 and 33 of integrated circuit devices 30 and 35, respectively, and E-Test pad 39. As a first step, photodefinable polyimide layer 45 is exposed to a light source. Portions of photodefinable polyimide layer 45 above bond pads 32 and 33 and E-Test pad 39 are protected from light exposure. The remaining photodefinable polyimide layer 45 is exposed and developed. During development, the unexposed region of photodefinable polyimide layer 45 is dissolved, exposing silicon nitride hard passivation layer 40 in those areas. Next, the remaining polyimide material is cured at high temperature. The exposed silicon nitride hard passivation layer 40 is then etched to remove silicon nitride from areas above bond pads 32 and 33 and E-Test pad 39. A suitable etchant is, for example, a $NF_3$/He and $SF_6$/He etch chemistries.

As shown in FIG. 10, hard passivation layer 40 and soft passivation layer 45 remain in a portion of scribe street area 37 although E-Test pad 39, along with bond pads 32 and 33, is partially exposed. The passivation process is now complete and E-Test pad 39 may be used to test scribe line test structures. Bond pad 32 of integrated circuit device 30 and bond pad 33 of integrated circuit device 35 can also be tested at this time. Once the devices are tested, passing devices are cut from the wafer and placed in a package. FIG. 11 illustrates the sawing process wherein the wafer is sawed through scribe street 37 to separate integrated circuit device 30 from integrated circuit device 35.

Once the integrated circuit devices are separated and placed in a package, the devices undergo a series of tests to evaluate their performance and their survival in the field. Various tests are done including, but not limited to, thermal cycling, moisture tests, impurity penetration, and reliability tests.

An integrated circuit device may be placed in a variety of packages. Common packages include ceramic, plastic, and other organic material packages. With regard to thermal cycling, plastic packages present a concern in that plastic and other organic material packages have a different thermal coefficient of expansion than a silicon-based device or chip. A typical thermal cycling test fluctuates the temperature to which a packaged device is exposed between approximately −80° C. and 150° C. Plastic and silicon do not expand and contract at the same rate when exposed to these temperature changes. The thermal coefficient of expansion of silicon is approximately three parts per million (ppm) while the thermal coefficient of expansion of a plastic substrate is approximately 20–25 ppm. Ceramic packages, on the other hand, have coefficients of thermal expansion very similar to silicon and do not show significant stresses due to the different materials. Thus, plastic and other organic material packages expand and contract much faster than their silicon-based contents which results in a great deal of stress between the package and the device or chip during thermal cycling. Nevertheless, plastic packages are preferred for other beneficial reasons, including cost and speed.

The stresses caused by thermal cycling result in particular failure areas in integrated circuit devices. One area of particular concern is the hard and soft passivation layers that overlie the integrated circuit devices, particularly in the area of the scribe street. It has been observed that during the thermal cycling process, the passivation layers experience a lifting or delamination of hard and soft passivation layer material. This is illustrated by reference numeral 42 in FIG. 11. It is believed that the delamination occurs because the interface between, for example, a silicon nitride hard passivation layer 40 and a polyimide soft passivation layer 45 is very weak.

Delamination between soft passivation layer 45 and hard passivation layer 40 is also seen during the saw process where individual devices are separated. The saw cutting process incurs damage to the passivation resulting in delamination at the interface between soft passivation layer 45 and hard passivation layer 40. In addition, during sawing, thin strips get separated from soft passivation layer 45 and form what are known as "stringers" 43, commonly polyimide stringers 43, that can get redeposited on top of the bond pads. Further, during sawing through E-test pad 39, thin strips of metal along with hard and soft passivation layer material get separated from the scribe street and form what are known as "lifted-edge metal" that can be redeposited on top of the bond pads. These metal stringers interfere with further processing and cause shorting between bond pads 32 and 33 and cause yield loss. Thus, the presence of stringers and lifted-edge metal on the metal pads interferes with and inhibits further processing and testing and results in yield loss.

Delamination 42 minimizes the integrity of the device, because the separated soft passivation layer 45 no longer serves as a protectant to the generally brittle hard passivation layer 40. Delamination also affects the integrity of the integrated circuit device by producing stringers that interfere with further processing and testing. These negative influences on integrated circuit device integrity causes the device to lose its robustness. A loss of robustness is equivalent to a yield loss as the integrated circuit device is no longer suitable for a prescribed use.

SUMMARY OF THE INVENTION

An integrated circuit passivation layer is disclosed. In one embodiment, the integrated circuit passivation layer includes a first passivation layer portion of silicon nitride treated with nitrous oxide and a second passivation layer portion of polyimide. In other aspects of the invention, methods of passivating an integrated circuit are disclosed.

Additional features and benefits of the invention will become apparent from the detailed description, figures, and claims set forth below.

DETAILED DESCRIPTION OF THE INVENTION

The invention relates to a passivation technology. The invention seeks to minimize the delamination between hard and soft passivation layers that generally occupy a top surface of an integrated circuit device by treating the hard passivation layer with an adhesion layer. In one embodiment, the hard passivation layer is a silicon nitride that is treated with nitrous oxide to form an adhesion layer of silicon oxynitride prior to the deposition of a photodefinable polyimide soft passivation layer coating. The surface treatment and formation of an adhesion layer improves the adhesion between the silicon nitride and the polyimide. The invention also minimizes delamination by eliminating passivation material from the scribe street area prior to separating devices, for example, by a sawing process. The creation of a passivation-free scribe street area eliminates passivation delamination typically caused during saw operation. The combined passivation technology provides a robust passivation resistant to thin film delamination, particularly in plastic packaged units.

In the following detailed description, numerous specific details are set forth such as material types, dimensions, processing steps, etc., in order to provide a thorough understanding of the invention. It is to be appreciated that these specific details need not be specifically adhered to in the practice the invention. In other instances, well known elements and processing techniques have not been shown in particular detail in order to avoid unnecessarily obscuring the invention.

Figure 12:
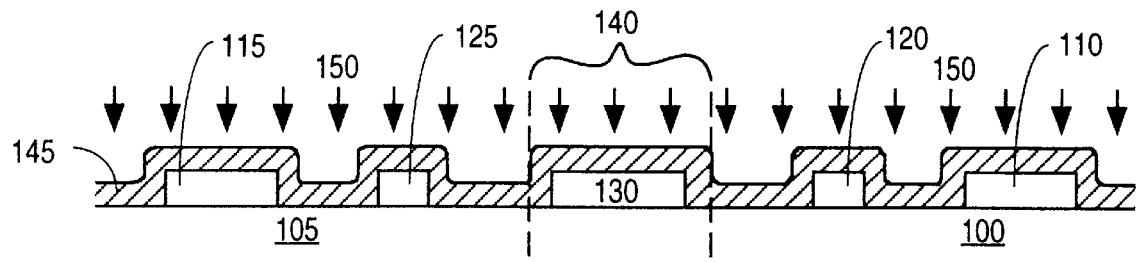
FIG. 12 is a schematic, cross-sectional, planar, side view illustration of a portion of a pair of integrated circuit devices on a wafer separated by a scribe street area and encompassed in a hard passivation layer and exposed to a nitrous oxide gas in accordance with an embodiment of the invention.

FIGS. 12–18 schematically illustrate cross-sectional side views of portions of adjacent integrated circuit devices of a semiconductor-based wafer undergoing a fabrication process to form, for example, microprocessors. FIG. 12 shows adjacent integrated circuit devices 100 and 105 separated by scribe street area 140. The top surface of integrated circuit devices 100 and 105 include bond pads 110 and 115, respectively. The top surface of integrated circuit devices 100 and 105 also include guard rings 120 and 125 that surround the periphery of the individual devices and serve a protective function. The top surface of scribe street area 140 includes E-Test pad 130. In one embodiment, bond pads 110 and 115, guard rings 120 and 125, and E-Test pad 130 are made of the same conductive material and form, for example, a fifth layer of conductive structures over the underlying semiconductor wafer. In this embodiment, the conductive material structures lie directly over a dielectric material, such as for example an oxide. Typical conductive material includes, but is not limited to, aluminum, aluminum-copper alloy, and aluminum-copper-silicon alloy. In one embodiment the conductive material is a multi-layer structure of titanium nitride (TiN) anti-reflective coating (ARC) layer overlying an aluminum-copper alloy overlying a layer of titanium. Overlying the conductive material structures (bond pads 110 and 115, guard rings 120 and 125, and E-Test pad 130) is hard passivation layer 145, such as for example, silicon nitride. Hard passivation layer 145 serves as a protectant to environmental contaminants, particularly moisture and ions. In one embodiment, hard passivation layer 145 is silicon nitride and is conformally deposited to a thickness of approximately 0.75 µm.

Figure 13:
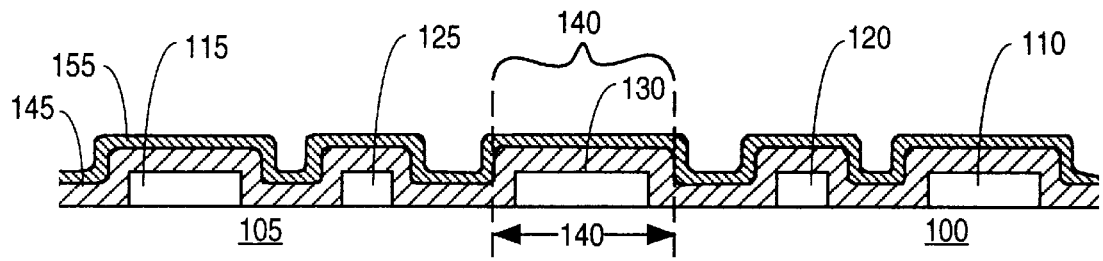
FIG. 13 is a schematic illustration of the portion of the integrated circuit devices of FIG. 12 encompassed in a hard passivation layer coated with an adhesion layer in accordance with an embodiment of the invention.

FIG. 12 shows the processing step of the invention wherein, in one embodiment, the top surface of the integrated circuit devices and scribe street area are exposed to an adhesion treatment to treat hard passivation layer 145. In one embodiment, hard passivation layer 145 is silicon nitride and is exposed to a nitrous oxide gas treatment 150. As shown in FIG. 13, the nitrous oxide gas treatment 150 forms adhesion layer 155 over the top surface of hard passivation layer 145. In the embodiment where hard passivation layer is silicon nitride, the nitrous oxide reacts with the silicon nitride to form an adhesion layer 155 of silicon oxynitride. The thickness of adhesion layer 155 should be sufficient to improve the adhesion between the hard and soft passivation layers. In one embodiment, an adhesion layer 155 of silicon oxynitride is formed at a thickness of approximately a few monolayers.

Figure 14:
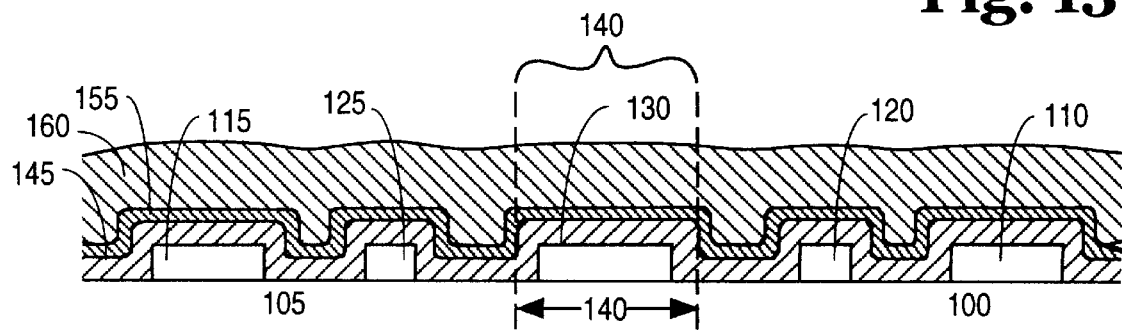
FIG. 14 is a schematic illustration of the portion of the integrated circuit devices of FIG. 12 encompassed in a hard passivation layer, an adhesion layer, and a soft passivation layer in accordance with an embodiment of the invention.

FIG. 14 shows the further processing step of depositing soft passivation layer 160 over the top surface of integrated circuit devices 100 and scribe street area 140. In one embodiment, soft passivation layer 160 is a photodefinable polyimide layer deposited to a thickness of approximately 11.5 µm.

Figure 15:
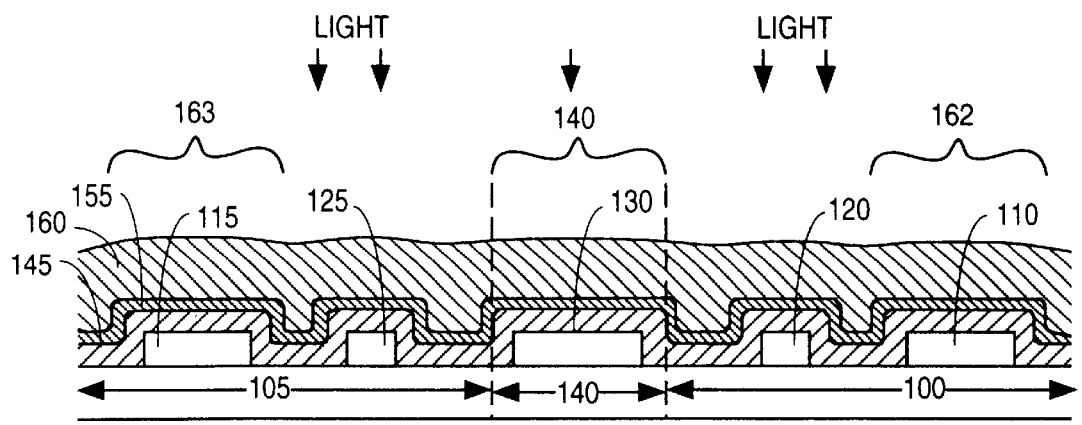
FIG. 15 is a schematic illustration of the portion of the integrated circuit devices of FIG. 12 showing the further processing step of exposing the soft passivation layer to a light source.

FIG. 15 shows the further processing step of exposing the top surface of integrated circuit devices 100 and 105 and E-Test pad 140 to a light source. In this step, portions 162 and 163 of polyimide layer 160 overlying bond pads 110 and 115, respectively, and a portion of polyimide layer 160 overlying all of scribe street area 140 is protected from light exposure. The remaining photodefinable polyimide layer 160 is exposed to ultraviolet light and developed. During development, the unexposed areas of photodefinable polyimide layer 160 is dissolved, exposing adhesion layer 155 in those areas. Exposed areas, on the other hand, react to light by cross-linking and hardening. It is to be appreciated that soft passivation layer 160 is not limited to a polyimide. Other soft passivation layer materials, such as for example, other polyimides or other organic materials, may be used and conventional techniques such as photolithography using a resist or wet etching can be used to expose adhesion layer 155.

Next, in the embodiment where soft passivation layer 160 is a photodefinable polyimide, the remaining polyimide material is cured, such as for example, by exposing the wafer to a temperature of approximately 400° C. During cure, polymer chains cross-link and imidize and solvent is driven away. This process makes polyimide layer 160 harder. This process also tightens distribution of some electrical parameters of the transistors.

The curing process results in some outgassing and formation of deposits/contaminants above the exposed adhesion layer 155. The presence of adhesion layer 155 and hard passivation layer 145 protect conductive structures 110, 115, and 130 from contamination by deposition and oxidation during the curing step.

Figure 16:
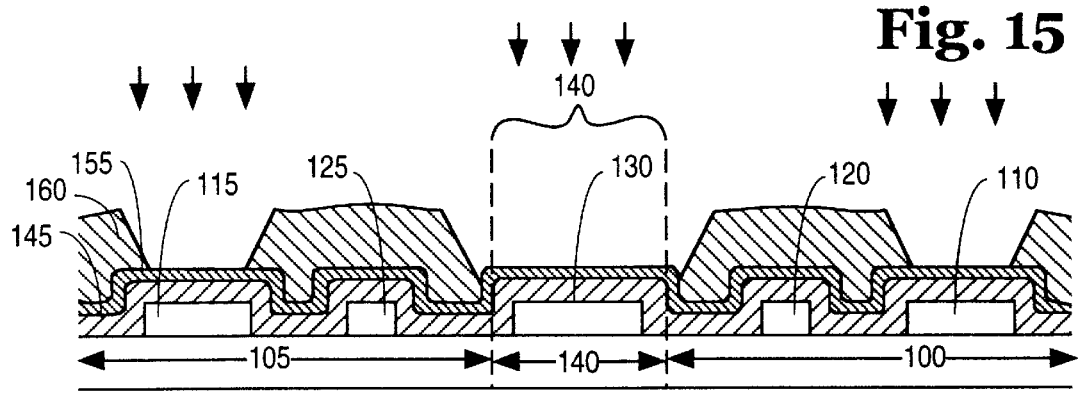
FIG. 16 is a schematic illustration of the portion of the integrated circuit devices of FIG. 12 showing the further processing step of forming openings through the soft passivation layer above bond pad areas and the scribe street area in accordance with an embodiment of the invention.

Once polyimide soft passivation layer 160 is cured, the exposed adhesion layer 155 is etched. Since the goal is to form an opening to bond pads 110 and 115 and to remove passivation layer material from scribe street area 140, hard passivation layer 145 must also be removed in these areas. In the embodiment where adhesion layer 155 is silicon oxynitride and hard passivation layer is silicon nitride, a plasma etch that removes both silicon oxynitride and silicon nitride and, in the case of a multi-layer conductive material described above, the TiN ARC layer, may be removed at this step. A typical etchant that will etch both silicon oxynitride, silicon nitride, and TiN ARC layer is, for example, a $NF_3/He$ and $SF_6/He$ etch chemistry. FIG. 16 illustrates combined etching step.

Figure 17:
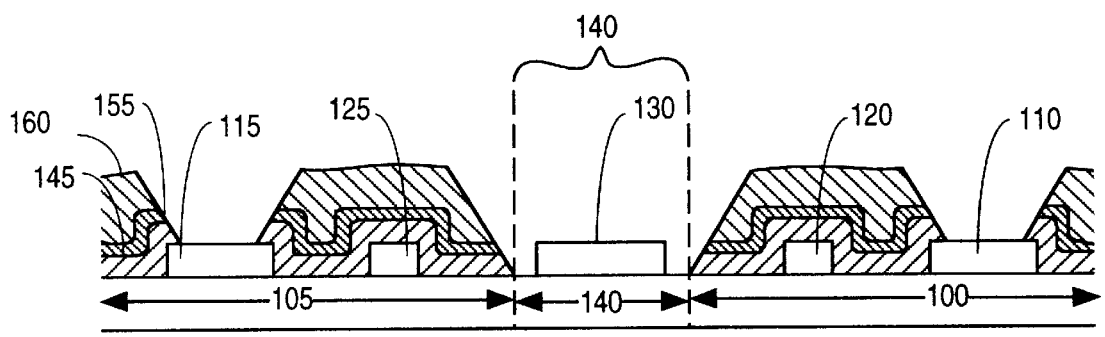
FIG. 17 is a schematic illustration of the portion of integrated circuit devices of FIG. 12 showing the further processing step of forming openings through the adhesion layer and hard passivation layer to the bond pads and in the scribe street area in accordance with an embodiment of the invention.

In the embodiment described, the silicon oxynitride/silicon nitride etch chemistry contained fluorine. In the process of this etch, it is possible that some fluorine containing residues were left on the surface of bond pads 110 and 115 and E-Test pad 130 or on polyimide soft passivation layer 160. To the extent that residual fluorine remains on the surface of the conductive materials, the fluorine might inhibit the bonding between the package and the bond pads or the testing of the bond pads with the E-Test pad. To remove such fluorine, an optional, very short duration, sputter etch (a safety etch) may be used. FIG. 17 shows exposed bond pad 110 and 115 and scribe street area 140 after the adhesion layer/hard passivation layer etch step and the optional sputter etch.

Once bond pads 110 and 115 and E-Test pad 130 are exposed, integrated circuit devices 100 and 105, respectively, are electrically tested using E-Test pad 130 and then sorted using bond pads 110 and 115 for proper operation. At this point, the wafer is tested for quality and then the devices are sorted in terms of performance, integrity, and robustness.

Figure 18:
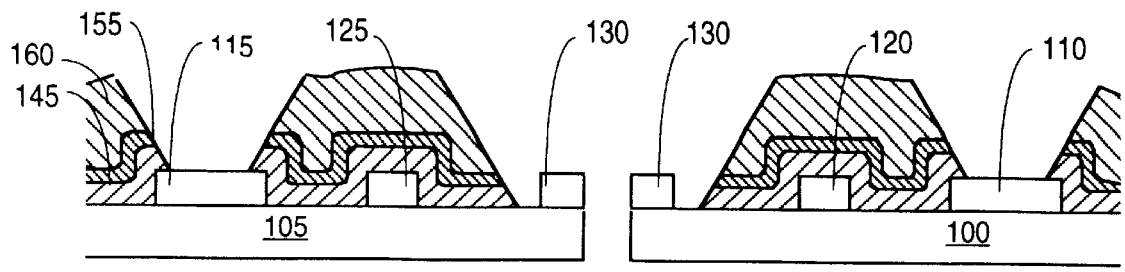
FIG. 18 is a schematic illustration of the portion of the integrated circuit devices of FIG. 12 showing the further processing step of separating adjacent integrated circuit devices through the scribe street area.

As noted above, the adhesion layer/hard passivation layer etch removed these materials from scribe street area 140. Thus, scribe street area 140 includes E-Test pad overlying a top oxide layer between integrated circuit devices 100 and 105. Next, as shown in FIG. 18, integrated circuit devices 100 and 105 are separated from one another such as, for example, by a sawing process through scribe street area 140. Since scribe street area 140 is free of hard and soft passivation layer materials, the sawing process does not induce damage to device 100 and 105 and delamination of soft passivation layer 160 or hard passivation layer 145. The sawing process does not produce stringers or lifted-edge metal thus increasing the device yield.

Figure 1:
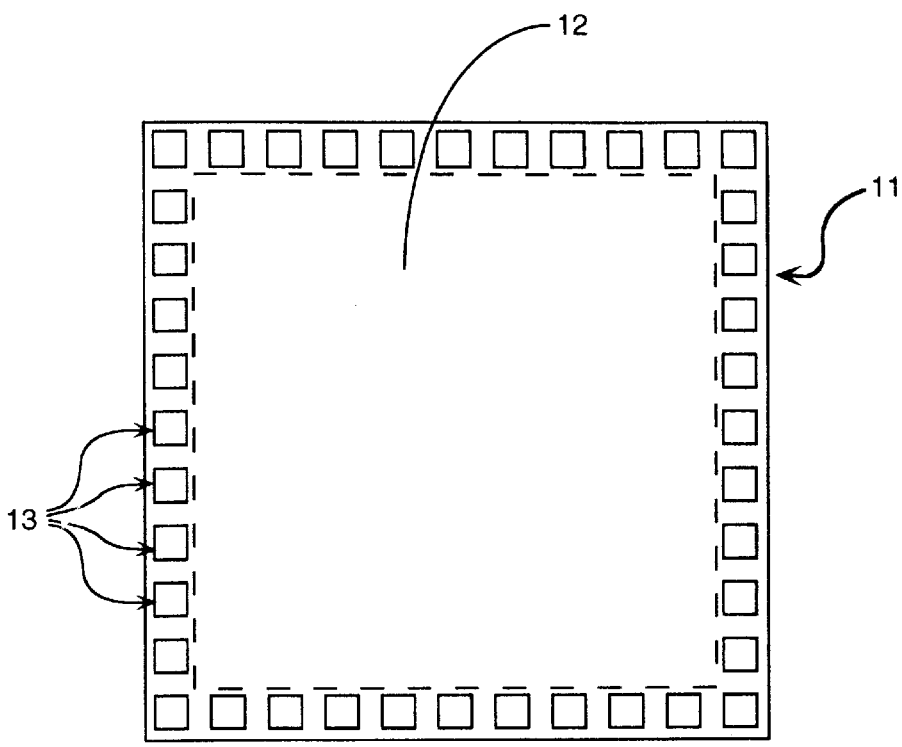
FIG. 1 is a schematic, planar, top view illustration of an integrated circuit device intended for wire bond packaging.
Figure 2:
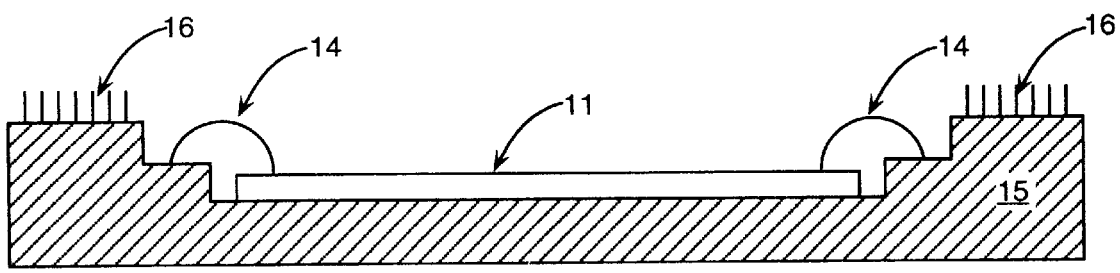
FIG. 2 is a schematic illustration of a cross-sectional, planar, side view of the integrated circuit device of FIG. 1 after the device has been packaged.
Figure 3:
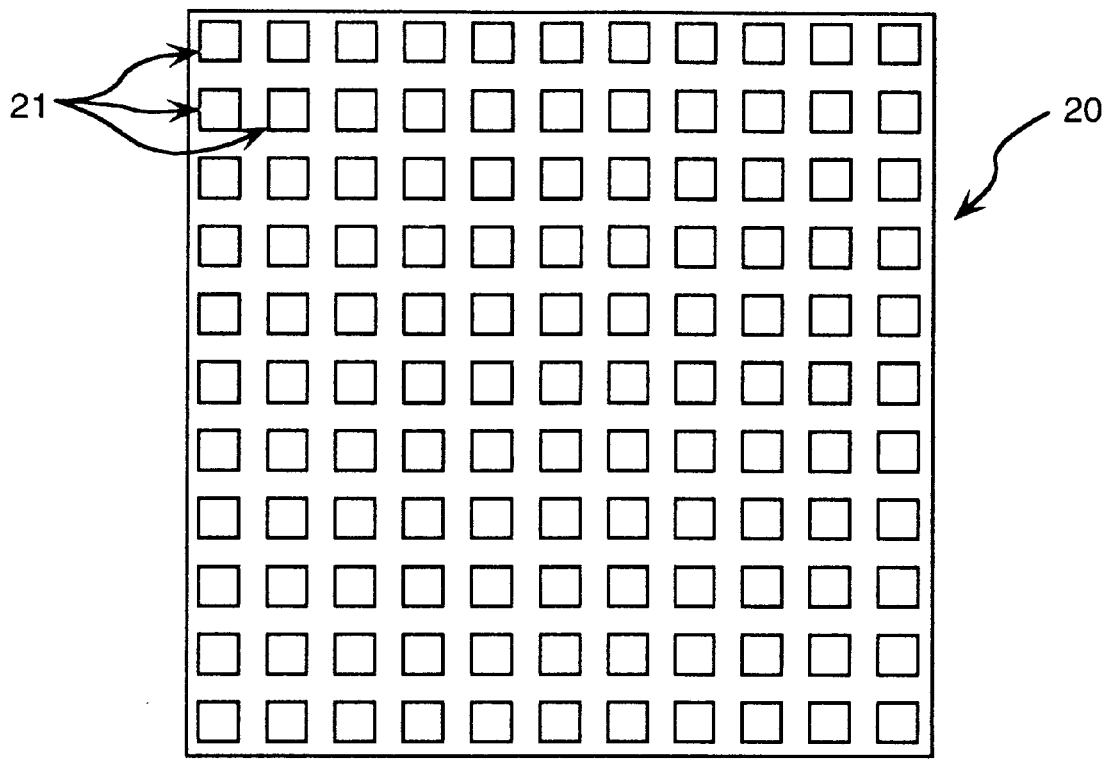
FIG. 3 is a schematic, planar, top view illustration of an integrated circuit device intended for C4 packaging.
Figure 4:
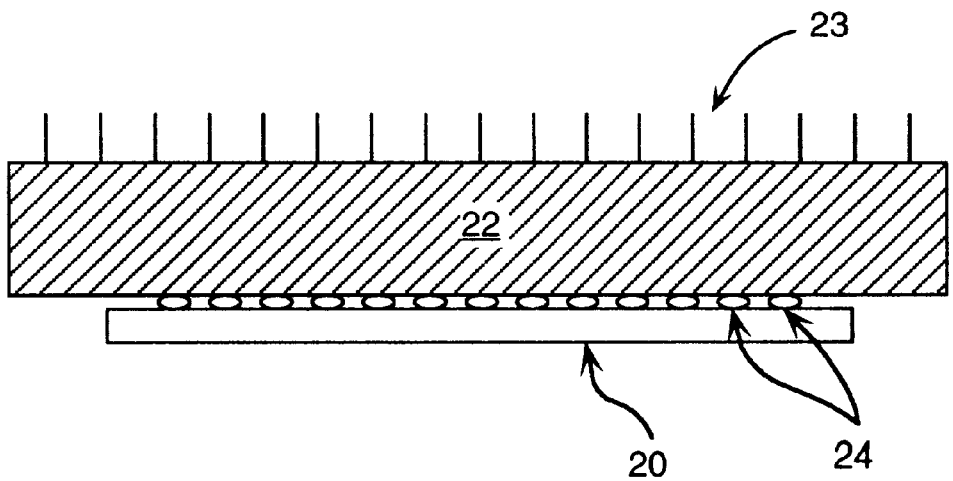
FIG. 4 is a schematic illustration of a cross-sectional, planar, side view of the integrated circuit device of FIG. 3 after the device has been packaged.
Figure 5:
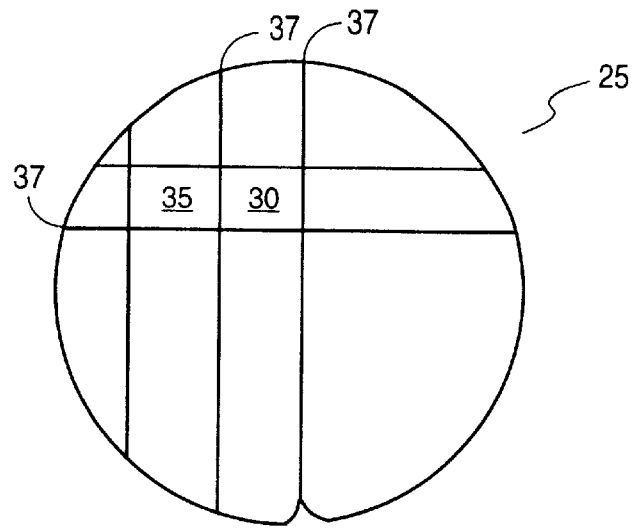
FIG. 5 is a schematic, planar, top view illustration of a semiconductor wafer having a plurality of integrated circuit devices formed on the wafer.

Once the sawing process is complete and the individual integrated circuit devices are isolated, integrated circuit device 100 (or integrated circuit device 105) is individually placed in a package. In one embodiment, integrated circuit device 100 (or integrated circuit device 105) is placed in a plastic or other organic material package and bonded to the package via a wire bond such as illustrated in FIG. 2. At this point, integrated circuit device 100 (or integrated circuit device 105) is again tested for integrity and performance through a battery of tests including thermal cycling, moisture resistance, impurity penetration resistance, and reliability.

The thermal cycling test, in particular, evaluates the performance of the package device in different environments. In one thermal cycling test, the package device is evaluated in temperatures ranging from −80° C. to 150° C. Since the device, typically a silicon semiconductor-based device is placed in a plastic package, the device experiences thermal stresses because of the different coefficients of thermal expansion of the materials. As noted above, these thermal stresses were particularly damaging to the device passivation, causing, for example, delamination. The presence of adhesion layer 155 between hard passivation layer 145 and soft passivation layer 160 minimizes the amount of delamination experienced in prior art structures during thermal cycling. Accordingly, the integrity of the packaged device formed by the process of the invention is greater than prior art devices, thus yielding a more robust integrated circuit device.

Figure 6:
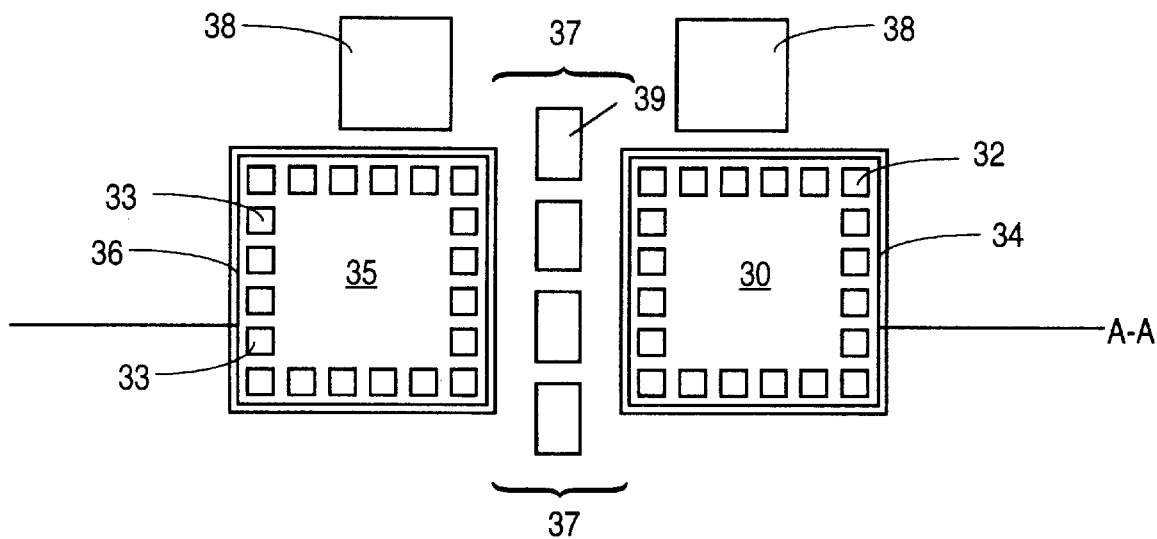
FIG. 6 is a schematic, planar, top view illustration of two integrated circuit devices formed on the semiconductor wafer of FIG. 5.
Figure 7:
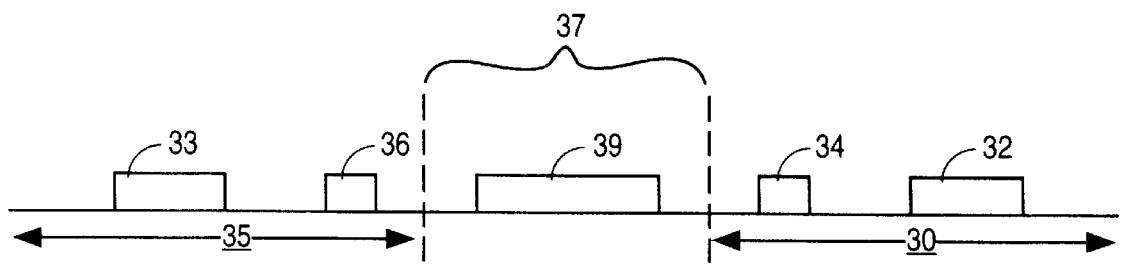
FIG. 7 is a schematic illustration of a cross-sectional, planar, side view taken through line A—A of FIG. 6.
Figure 8:
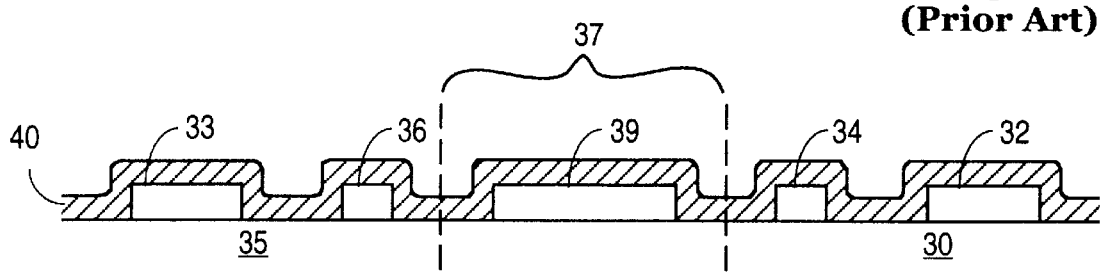
FIG. 8 is a schematic illustration of the portion of the integrated devices of FIG. 7 encompassed in a hard passivation layer.
Figure 9:
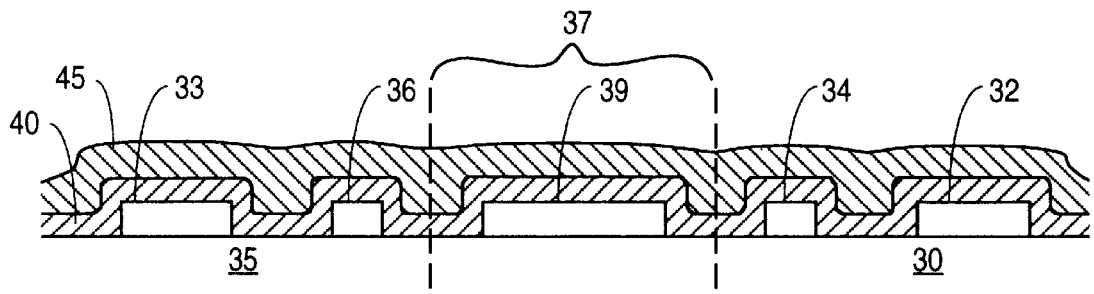
FIG. 9 is a schematic illustration of a portion of the integrated circuit devices of FIG. 7 encompassed in hard and soft passivation layers.
Figure 10:
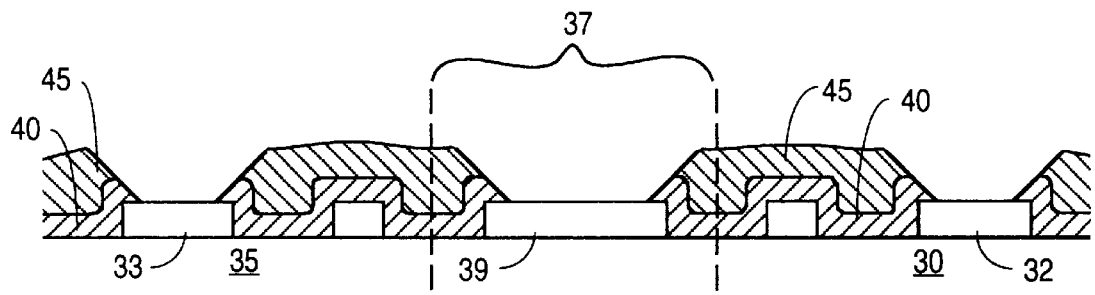
FIG. 10 is a schematic illustration of the portion of the integrated circuit devices of FIG. 7 encompassed in hard and soft passivation layers with openings to metal bond pads and an E-Test pad between the devices.
Figure 11:
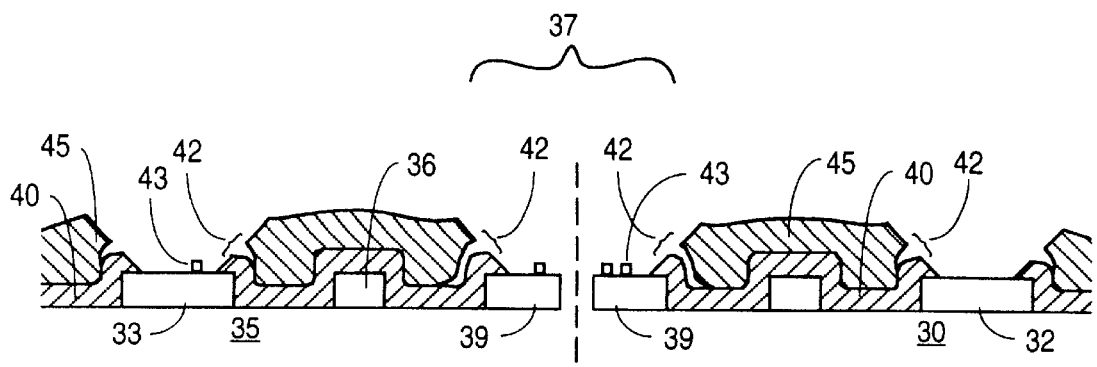
FIG. 11 is a schematic illustration of a portion of the integrated circuit devices of FIG. 7 showing the devices separated from one another through a cutting step.

A further advantage of the removal of passivation layer material from the scribe street area is that such removal allows the unrestricted placement of additional alignment marks along the scribe street, and it does not restrict the number of alignment marks that can be placed. As shown in FIG. 6, alignment marks 38 are typically larger or occupy a larger area than E-Test pads and other structures typically placed in the scribe street area. As noted above, alignment marks 38 are used by the wafer processing equipment to properly place structures on the individual integrated circuit devices during wafer processing. In prior art processes, where passivation layer material remained in the scribe street area, the placement of alignment marks was limited because of their size and the likelihood that a sawing process through large alignment marks was expected to result in increased damage to devices and delamination of the passivation layer materials rendering unit yield loss.

Since the invention contemplates that the scribe street area is virtually free of passivation layer material, a sawing processes through the alignment marks does not add additional damage to the passivation material. Accordingly, additional alignment marks may be placed in scribe street areas throughout the wafer without the concern for delamination damage. Additional alignment marks facilitates and more tightly defines the location and fabrication of devices and areas in the fabrication process.

In FIGS. 12–18, a passivation technology was described with reference to an integrated circuit device intended for wire bond packaging. It is to be appreciated that the same technology may be used with C4 platform technology. With the C4 platform, the entire integrated circuit device or unit is assembled, typically through solder bumps, to the package as compared to a wire bond platform where the package bonds to the peripheral bond pads of the device through wire bonds. Thus, it is to be appreciated that the thermal stresses experienced by a C4 platform tend to be much greater than the thermal stresses experienced for a wire bond platform. Accordingly, the benefits of utilizing an adhesion layer between hard and soft passivation layers overlying a C4 fabricated device and the freeing of scribe street areas from passivation in such a device is particularly beneficial.

Figure 19:
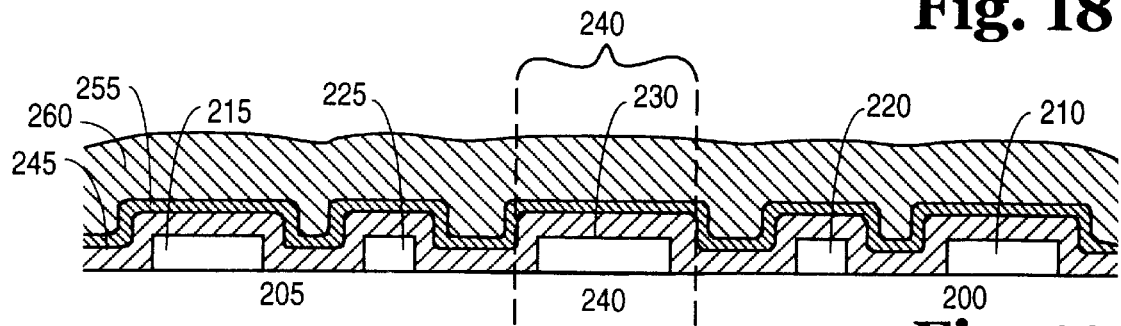
FIG. 19 is a schematic, cross-sectional, planar, side view illustration of portions of a pair of integrated circuit devices on a semiconductor wafer separated by a scribe street area and having a hard passivation layer, an adhesion layer, and a soft passivation layer overlying metal structures in accordance with a second embodiment of the invention.
Figure 20:
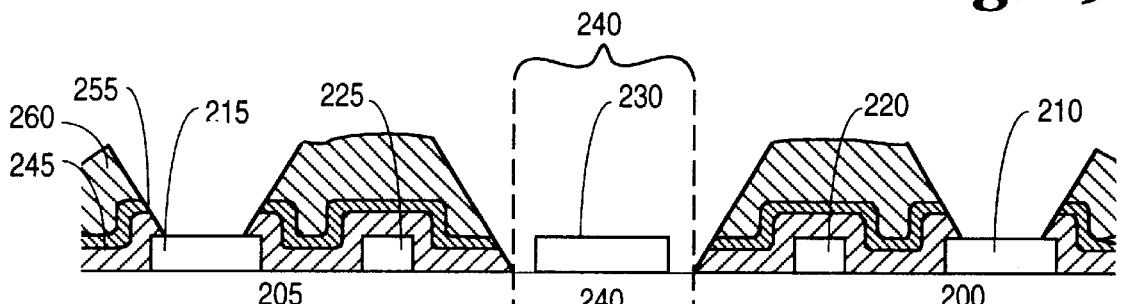
FIG. 20 is a schematic illustration of the portion of the integrated circuit devices of FIG. 19 showing openings to bond pads of the integrated circuit devices and removal of passivation material from a scribe street area in accordance with a second embodiment of the invention.
Figure 21:
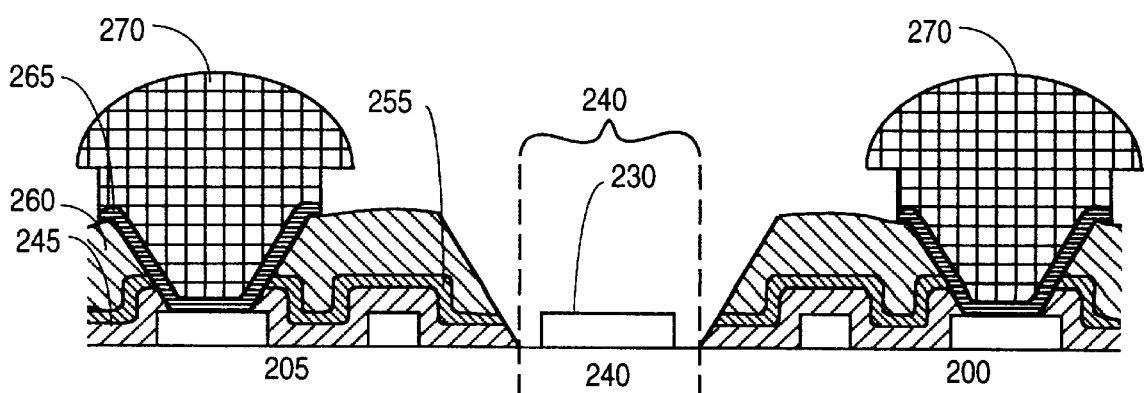
FIG. 21 is a schematic illustration of the portion of the wafer of FIG. 19 showing solder bumps formed over bond pads of the integrated circuit devices in accordance with a second embodiment of the invention.

FIGS. 19–21 succinctly illustrate the process steps of the process described in FIGS. 12–18 for use with a C4 platform integrated circuit devices 200 and 205. In FIG. 19, integrated circuit devices 200 and 205 are separated by a scribe street area 240. Integrated circuit devices 200 and 205 contain conductive material bond pads 210 and 215, respectively, and guard rings 220 and 225, respectively. Scribe street area 240 contains E-Test pad 230. Overlying the conductive structures of the wafer is a first hard passivation layer of, for example, silicon nitride. Adjacent the top surface of hard passivation layer 245 is an adhesion layer 255 of, for example, silicon oxynitride. In one embodiment, silicon oxynitride layer is formed by exposing hard passivation layer 245 of silicon nitride to a nitrous oxide treatment. Overlying adhesion layer 255 is soft passivation layer 260 of, for example, photodefinable polyimide. For a more detailed description of the formation of hard passivation layer 245, soft passivation layer 260, and adhesion layer 255, reference is made to FIGS. 12–15 and the accompanying text.

Next, as shown in FIG. 20, bond pads 210 and 215 of integrated circuit devices 200 and 205, respectively, are opened as described above with reference to FIGS. 16 and 17 and the accompanying text. FIG. 20 also shows that passivation layers 245 and 260 and adhesion layer 255 have been completely removed from scribe street area 240. At this point, integrated circuit device 200 and 205 are sorted using bond pads 210 and 215 and device quality is electrically tested by using E-Test pads, such as for example, E-Test pad 230 throughout the scribe street areas of the wafer. Next, as shown in FIGS. 21, solder bumps 270 are formed over bond pads 210 and 215 of integrated circuit devices 200 and 205, typically over a base layer(s) of conductive material 265. Once solder bumps 270 are formed to the individual bond pads, integrated circuit devices 200 and 205 are separated via a sawing process as described above with reference to FIG. 18 and the accompanying text. At this point, the individual devices are packaged by inverting the devices and placing them in, for example, an organic package. Once packaged, the integrated circuit devices are subjected to a battery of tests as described above with the wire bond packaged devices.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of passivating an integrated circuit comprising:

depositing a first passivation layer of silicon nitride over the top surface of a portion of an integrated circuit substrate;

treating an exposed surface of the first passivation layer to form a layer comprising silicon oxynitride; and depositing a second passivation layer over the first passivation layer.

2. A method of forming an integrated circuit comprising:

depositing a first passivation layer comprising silicon nitride over a surface of an integrated circuit;

treating a surface of said first passivation layer with a gas comprising nitrous oxide in an amount sufficient to modify an adhesive property of the first passivation layer; and depositing a second passivation layer over the first passivation layer, wherein treating a surface of said first passivation layer with a gas comprises transforming a portion of said first passivation layer into an adhesion layer, wherein said adhesion layer comprises silicon oxynitride.

* * * * *

UNITED STATES PATENT AND TRADEMARK OFFICE
CERTIFICATE OF CORRECTION

PATENT NO. : 6,046,101
DATED : March 4, 2000
INVENTOR(S) : Zhu

It is certified that error appears in the above-identified patent and that said Letters Patent is hereby corrected as shown below:

In column 10, at line 44, delete "a" and insert --an--.

Signed and Sealed this

Fifteenth Day of May, 2001

*Attest:*

NICHOLAS P. GODICI

*Attesting Officer*     *Acting Director of the United States Patent and Trademark Office*